United States Patent [19]
Murakawa

[11] Patent Number: 5,483,496
[45] Date of Patent: Jan. 9, 1996

[54] NONVOLATILE MEMORY DEVICE HAVING A TIMER CIRCUIT

[75] Inventor: Kazuhiko Murakawa, Tokyo, Japan

[73] Assignee: Seiko Instruments Inc., Tokyo, Japan

[21] Appl. No.: 228,968

[22] Filed: Apr. 18, 1994

[30] Foreign Application Priority Data

Apr. 28, 1993 [JP] Japan ................... 5-102946

[51] Int. Cl.⁶ ........................... G11C 8/00
[52] U.S. Cl. .................. 365/233; 365/191; 365/195; 365/185.23; 365/226
[58] Field of Search .................. 365/185, 191, 365/195, 189.02, 228, 233, 236, 230.01

[56] References Cited

U.S. PATENT DOCUMENTS

| 5,265,063 | 11/1993 | Kogure | 365/233 |
| 5,315,557 | 5/1994 | Kim | 365/228 X |
| 5,371,715 | 12/1994 | Kim | 365/233 |
| 5,381,366 | 1/1995 | Kawauchi | 365/185 |

*Primary Examiner*—David C. Nelms
*Assistant Examiner*—Son Mai
*Attorney, Agent, or Firm*—Loeb and Loeb

[57] ABSTRACT

When execution of a program is interrupted during erasure or writing, electric charge normally remains due to high voltage. This charge is electrically discharged to thereby prevent erroneous erasure, erroneous writing, and erroneous reading. It comprises a timer circuit for producing a shortened program timing pulse when execution of a program is interrupted, together with a word line driver, a control line driver, and a bit line driver which are controlled by the timer circuit. A program-interrupting signal 30 is applied to a selector 23 which then switches the connected clock-generating circuit from a clock-generating circuit 21 to a clock-generating circuit 22 of a higher clock frequency in response to the signal 30. Therefore, when the execution of the program is interrupted, the shortened program timing pulse for interruption is applied to each memory cell. When execution of a program is interrupted during erasure or writing, erroneous erasure, erroneous writing, and erroneous reading can be prevented.

5 Claims, 4 Drawing Sheets

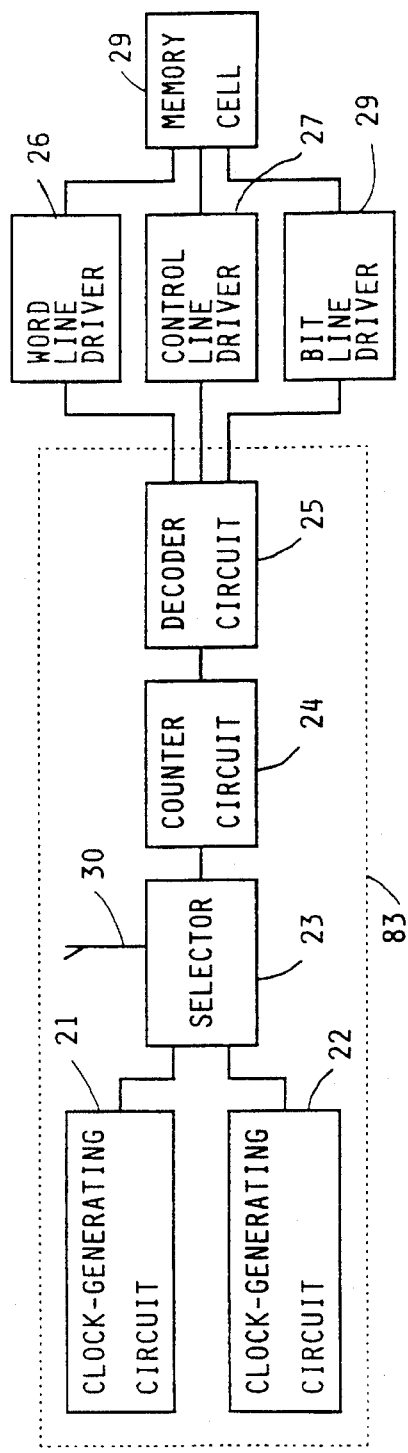
F I G. 3
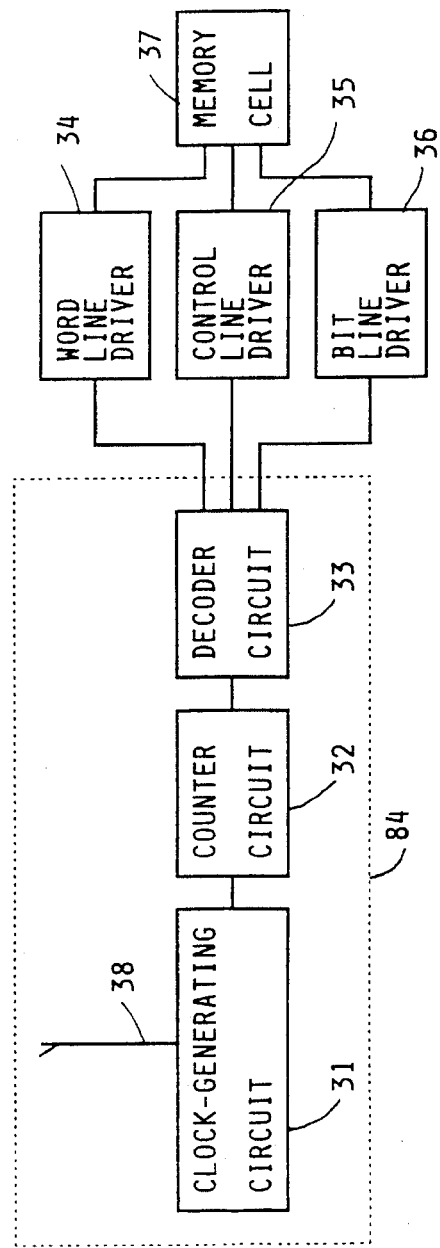
F I G. 4

NONVOLATILE MEMORY DEVICE HAVING A TIMER CIRCUIT

BACKGROUND OF THE INVENTION

The present invention relates to an electrically erasable nonvolatile memory, or an EEPROM, having semiconductor memory cells including selecting MIS transistors, storage MIS transistors, control MIS transistors, word lines, control lines, and bit lines.

Referring to FIG. 5, a conventional EEPROM has memory cells 48 in which selected word line 40 and control line 41 are set high (20 V) during erasure. At the same time, a control gate 46 selected by these lines is set high. During writing, selected word line 40 and bit line 42 are set high. At the same time, the drain 47 of a storage MIS transistor 45 selected by them is set high. When the erasure or the writing ends, the supply of the high voltage is stopped. When the erasure ends, the source of the high voltage is kept at ground level (0 V) for a given time (several microseconds) while maintaining the control line 41 and the control gate 46 in selected state. When the writing ends, the source of the high voltage is kept at ground level for a given time while maintaining the bit line 42 and the drain 47 of the storage MIS transistor 45 in selected state. In this way, when the erasure ends, the selected control line 41 and control gate 46 are electrically discharged. When the writing ends, the selected bit line 42 and the drain 47 of the storage MIS transistor 45 are electrically discharged.

Referring to FIG. 6, a timer circuit 85 has a clock-generating circuit 49 to which a program-interrupting signal 56 is coupled. The clock-generating circuit 49 is connected with a counter circuit 50, which is in turn connected with a decoder circuit 51. A word line driver 52, a control line driver 53, and a bit line driver 54 are connected with the timer circuit 85 and also with memory cells 55. The aforementioned program-interrupting signal 56 is also coupled to the memory cells 55. This timer circuit controls the potentials at the word line 40, the control line 41, and the bit line 42.

In the conventional EEPROM, if the program is interrupted during erasure or writing, the word lines selected immediately before the interruption of the program drop to ground level. The control lines or bit lines selected immediately before interruption of the program are released, i.e., have high impedance. Therefore, electric charge remains either on the control lines and the control gates or on the bit lines and the drains of the storage MIS transistors due to the high voltage. As a result, erroneous erasure, erroneous writing, and erroneous reading take place. Accordingly, the present invention is intended to solve this problem with the prior art techniques. It is an object of the present invention to provide an EEPROM which electrically discharges electric charge due to high voltage on a memory array by shortening a program timing pulse when the program is interrupted during erasure or writing and ending the program with a short cycle, whereby preventing erroneous erasure, erroneous writing, and erroneous reading.

SUMMARY OF THE INVENTION

To solve the above problem, the present invention is so configured that it comprises: a timer circuit for producing a shorter interrupting program timing pulse during interruption of the program; and a means for ending the program after securing a time permitting the timing pulse to electrically discharge the program voltage on the memory array. When the program is interrupted during erasure or writing, electric charge due to high voltage is prevented from remaining on the memory array. Thus, erroneous erasure, erroneous writing, and erroneous reading are prevented.

In the EEPROM constructed as described above, a shortened program timing pulse produced from the timer circuit during interruption of a program acts to electrically discharge the high voltage on the memory array. In this way, erroneous erasure, erroneous writing, and erroneous reading are prevented.

BRIEF DESCRIPTION OF THE DRAWINGS

FIG. 3 is a block diagram of an EEPROM of Example 3 of the present invention;

FIG. 4 is a block diagram of an EEPROM of Example 4 of the present invention;

DETAILED DESCRIPTION OF THE PREFERRED EMBODIMENTS

Figure 1:
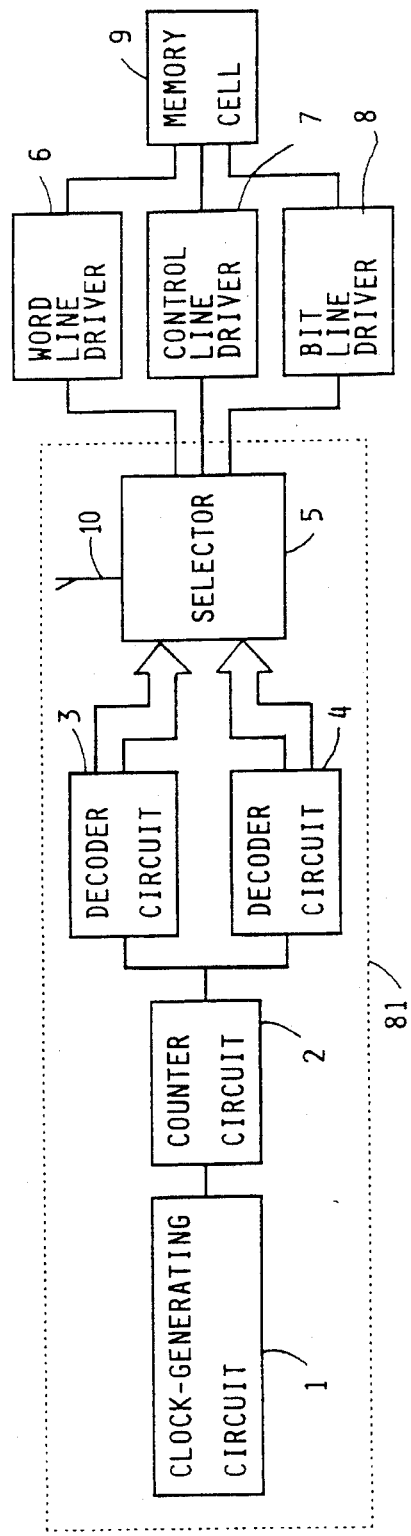
FIG. 1 is a block diagram of an EEPROM of Example 1 of the present invention.

Embodiments of the present invention are described hereinafter by referring to the drawings.

FIG. 1 is an embodiment of the present invention. A timer circuit 81 has a clock-generating circuit i providing clock pulses connected with a counter circuit 2, which is in turn connected with decoder circuits 3 and 4 that decode their input timing signals in different ways. The decoder circuits 3 and 4 are connected with a selector 5 to which a program-interrupting signal 10 is coupled. A word line driver 6, a control line driver 7, and a bit line driver 8 are connected with the timer circuit 81 and also with memory cells 9. When the program-interrupting signal 10 is applied to the selector 5, the decoder circuit connected into the circuitry is switched from the decoder circuit 3 to the decoder circuit 4. This shortens the interval during which a program is run, compared with the interval used in normal situation. A discharging pulse is applied to the memory cells and then the execution of the program is ended.

Figure 2:
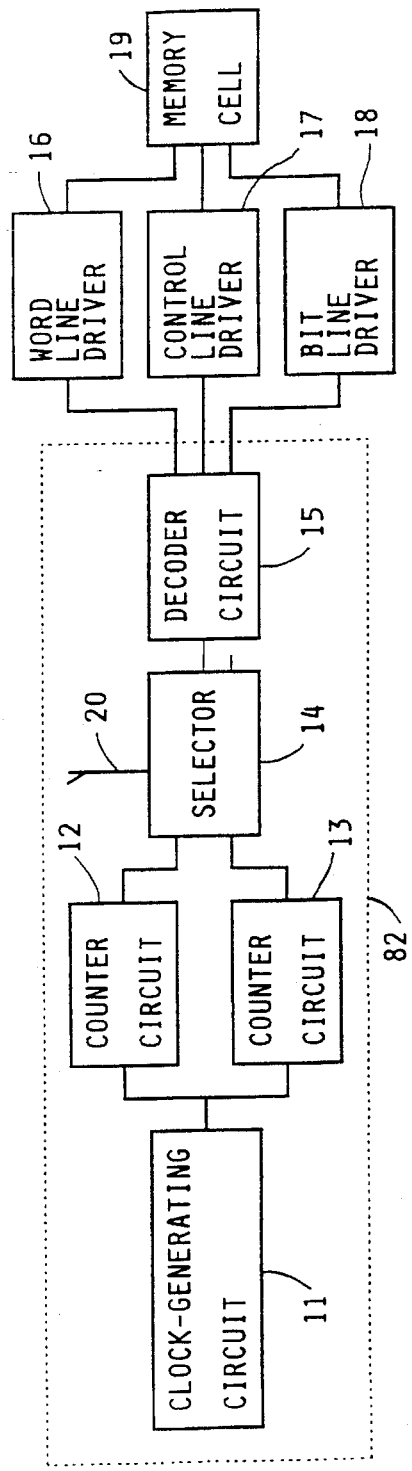
FIG. 2 is a block diagram of an EEPROM of Example 2 of the present invention.
Figure 5:
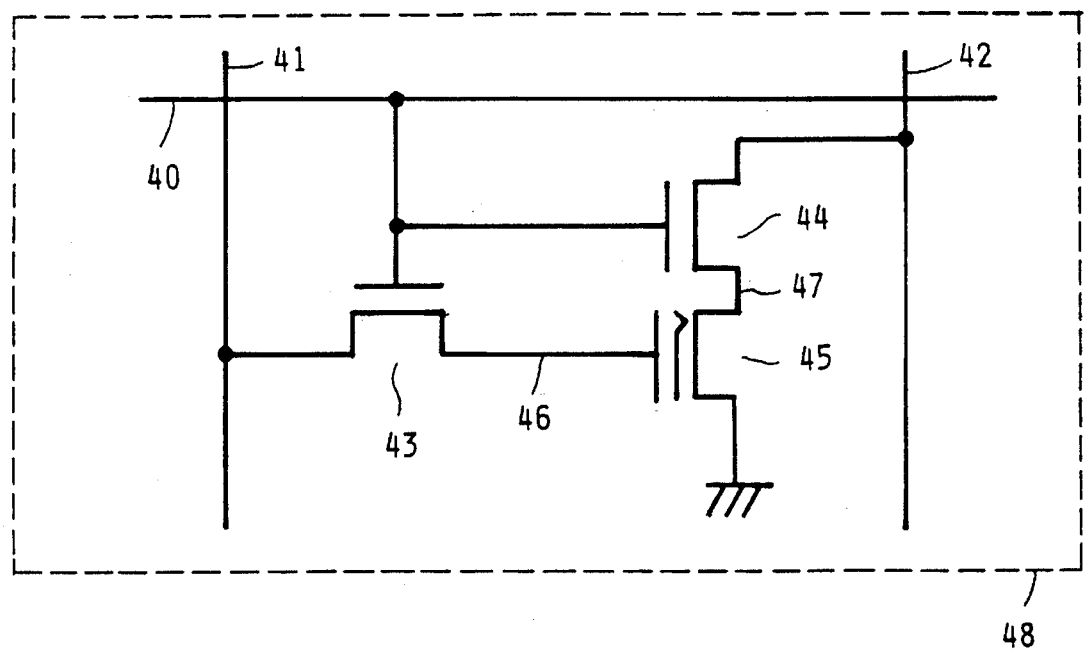
FIG. 5 is a circuit diagram of a memory cell of a conventional EEPROM.
Figure 6:
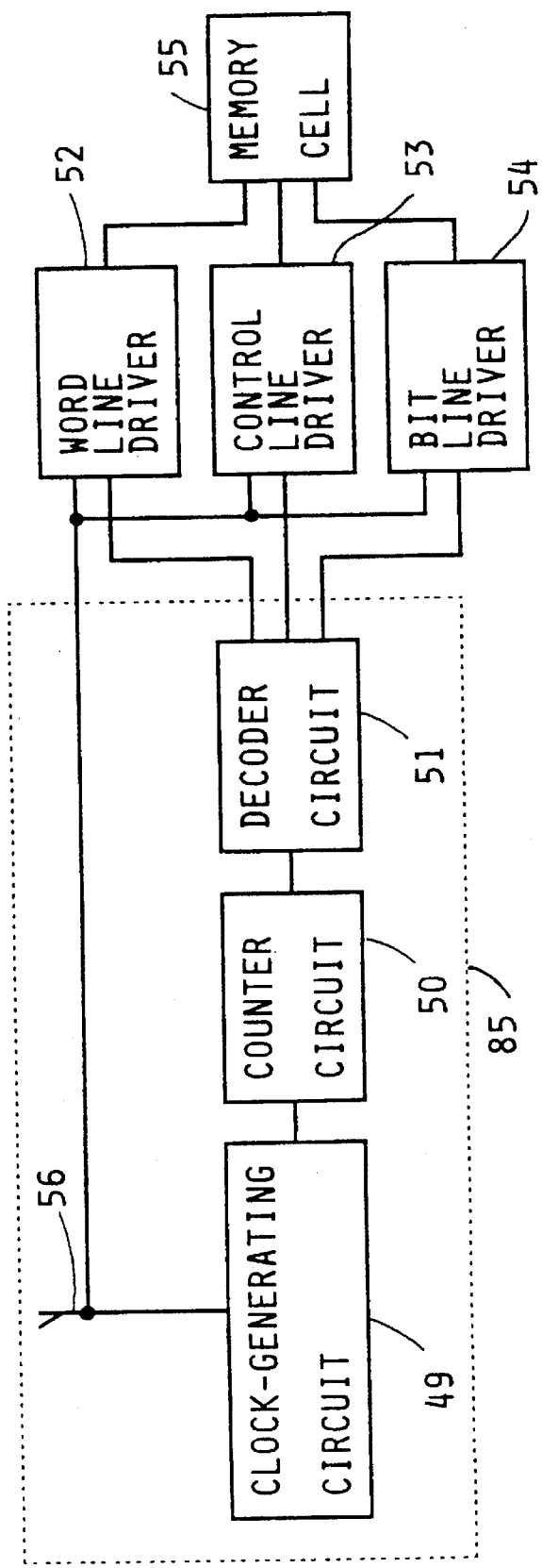
FIG. 6 is a block diagram of the conventional EEPROM.

FIG. 2 is an embodiment of the present invention. A timer circuit 82 has a clock-generating circuit 11 providing clock pulses connected with counter circuits 12 and 13 which differ in count. The counter circuits 12 and 13 providing timing pulses are connected with a selector 14, which is in turn connected with a decoder circuit 15. A program-interrupting signal 20 is coupled to the selector 14. A word line driver 16, a control line driver 17, and a bit line driver 18 are connected with the timer circuit 82 and also with memory cells 19. When the program-interrupting signal 20 is applied to the selector 14, the decoder circuit connected into the circuitry is switched from the counter circuit 12 to the counter circuit 13. This shortens the interval during which a program is run, compared with the interval used in normal situation. A discharging pulse is applied when the program is ended. Subsequently, the execution of the program is ended.

FIG. 3 is one embodiment of the invention. A timer circuit 83 has clock-generating circuits 21 and 22 of different frequencies. These clock-generating circuits 21 and 22 are connected with a selector 23, which is in turn connected with a counter circuit 24. A program-interrupting signal 30 is coupled to the selector 23. The counter circuit 24 is connected with a decoder circuit 25. A word line driver 26, a control line driver 27, and a bit line driver 28 are connected with the timer circuit 83 and also with memory cells 29. When the program-interrupting signal 30 is applied, the clock-generating circuit connected into the circuitry is switched from the clock-generating circuit 21 to the clock-generating circuit 22 having a higher frequency. This shortens the period of the execution of the program. After discharging, the execution of the program is ended.

FIG. 4 is one embodiment of the invention. A timer circuit 84 has a clock-generating circuit 31 providing clock pulses whose frequency can be varied in response to a program-interrupting signal 38. The clock-generating circuit 31 is connected with a counter circuit 32, which is in turn connected with a decoder circuit 33. The program-interrupting signal 38 is coupled to the counter circuit 32. A word line driver 34, a control line driver 35, and a bit line driver 36 are connected with the timer circuit 84 and also with memory cells 37. When the program-interrupting signal 38 is applied, the clock-generating circuit 31 produces clock signals of a higher frequency. This shortens the period of the execution of the program. After discharging, the execution of the program is ended.

As described thus far, the present invention is so constructed that when execution of a program is interrupted, a timer circuit produces a shortened program timing pulse to electrically discharge electric charge remaining on a memory array due to high voltage, and then the execution of the program is ended. When the execution of the program is interrupted during erasure or writing, electric charge is prevented from remaining on the memory array in spite of the presence of the high voltage. Thus, erroneous erasure, erroneous writing, and erroneous reading are prevented.

What is claimed is:

1. A nonvolatile memory device having electrically erasable nonvolatile memory cells, and a timer circuit for producing normal program timing pulses for executing a program to the electrically erasable nonvolatile memory cells, wherein the timer circuit provides a shortened program timing pulse for the electrically erasable nonvolatile memory cells in response to an external-interrupting signal provided to the timer circuit during interruption of the program, a cycle of the shortened program timing pulse being shorter than that of the normal program timing pulses during normal execution of the program so that the program is ended after discharging electric charges in the electrically erasable nonvolatile memory cells by the shortened program timing pulse.

2. A nonvolatile memory device according to claim 1, wherein the timer circuit comprises a selector for providing the program timing pulses to the electrically erasable nonvolatile memory cells, a first decoder circuit for providing the program timing pulses to the selector, and a second decoder circuit for providing the shortened program timing pulse to the selector, wherein the selector selects the shortened program timing pulse as an output to the electrically erasable nonvolatile memory cells in response to the external-interrupting signal applied to the selector.

3. A nonvolatile memory device according to claim 1, wherein the timer circuit comprises a decoder circuit for providing the program timing pulses to the electrically erasable nonvolatile memory cells, a selector for providing timing pulses to the decoder circuit, a first counter circuit for providing first timing pulses to the selector, and a second counter circuit for providing a second timing pulse which is shorter than the first timing pulses to the selector, wherein the selector selects the second timing pulse as an output to the decoder in response to the external-interrupting signal applied to the selector so that the decoder provides the shortened program timing pulse to the electrically erasable nonvolatile memory cells.

4. A nonvolatile memory device according to claim 1, wherein the timer circuit comprises a decoder circuit for providing the program timing pulses to the electrically erasable nonvolatile memory cells, a counter circuit for providing timing pulses to the decoder circuit, a selector for providing clock pulses to the counter circuit, a first clock-generating circuit for providing first clock pulses to the selector, and a second clock-generating circuit for providing a second clock pulse which is shorter than the first clock pulses to the selector, wherein the selector selects the second clock pulse as an output to the counter circuit in response to the external-interrupting signal applied to the selector so that the decoder provides the shortened program timing pulse to the electrically erasable nonvolatile memory cells.

5. A nonvolatile memory device according to claim 1, wherein the timer circuit comprises a decoder circuit for providing the program timing pulses to the electrically erasable nonvolatile memory cells, a counter circuit for providing timing pulses to the decoder circuit, and a clock-generating circuit for providing clock pulses to the counter circuit, wherein the clock-generating circuit provides a shorter cycle of the clock pulses in response to the external-interrupting signal applied to the clock-generating circuit than a cycle of the clock pulse during normal program, so that the decoder provides the shortened program timing pulse to the electrically erasable nonvolatile memory cells coupled with the external-interrupting signal.

* * * * *